United States Patent [19]
Gill et al.

[11] Patent Number: 5,045,489
[45] Date of Patent: Sep. 3, 1991

[54] METHOD OF MAKING A HIGH-SPEED 2-TRANSISTOR CELL FOR PROGRAMMABLE/EEPROM DEVICES WITH SEPARATE READ AND WRITE TRANSISTORS

[75] Inventors: Manzur Gill, Rosharon; David D. Wilmoth, Plano, both of Tex.

[73] Assignee: Texas Instruments Incorporated, Dallas, Tex.

[21] Appl. No.: 374,372

[22] Filed: Jun. 30, 1989

[51] Int. Cl.$^5$ .......................................... H01L 21/265
[52] U.S. Cl. ....................................... 437/43; 437/48; 437/49; 437/50; 437/52; 437/61; 357/23.5
[58] Field of Search ................. 437/43, 48, 49, 50, 437/52, 61; 357/23.5

[56] References Cited
U.S. PATENT DOCUMENTS

| 4,258,466 | 3/1981 | Kuo | 437/48 |
| 4,317,272 | 3/1981 | Kuo et al. | 437/49 |
| 4,317,273 | 3/1982 | Guterman et al. | 437/50 |
| 4,326,331 | 4/1982 | Gutermen | 437/43 |
| 4,372,031 | 2/1983 | Tsaur et al. | 357/23.5 |
| 4,376,947 | 3/1983 | Chiu et al. | 357/23.5 |
| 4,379,343 | 4/1983 | Moyer | 375/23.5 |
| 4,467,453 | 8/1984 | Chiu et al. | 357/23.5 |
| 4,628,487 | 12/1986 | Smayling | 357/23.5 |
| 4,780,424 | 10/1988 | Holler | 437/43 |

OTHER PUBLICATIONS

"A 19-ns 250-mW CMOS Eraseable Programmable Logic Device", by Pathak et al., *IEEE Journal of Solid State Circuits*, vol. 5C-21, No. 5, Oct. 1986, pp. 775-784.

Primary Examiner—Brian E. Hearn
Assistant Examiner—Gordon V. Hugo
Attorney, Agent, or Firm—Theodore D. Lindgren; Lawrence J. Bassuk; Melvin Sharp

[57] ABSTRACT

A 2-transistor cell (26) comprises buried diffused regions (34, 36 and 38) aligned substantially parallel. Floating gates (40) are aligned substantially perpendicular to the diffused regions (34, 36 and 38). A control gate (42) defines a first channel region between first and second diffused regions (34 and 36) to define a read transistor (30) and a second channel region between second and third diffused regions (36 and 38) to define a program transistor. The read transistor (30) and program transistor (32) may be individually optimized according to their respective functions. Further, tunnel windows (70) may be provided for Fowler-Nordheim tunneling.

10 Claims, 4 Drawing Sheets

METHOD OF MAKING A HIGH-SPEED 2-TRANSISTOR CELL FOR PROGRAMMABLE/EEPROM DEVICES WITH SEPARATE READ AND WRITE TRANSISTORS

TECHNICAL FIELD OF THE INVENTION

This invention relates in general to integrated circuits, and more particularly to a 2-transistor non-volatile memory device.

BACKGROUND OF THE INVENTION

Circuits used for memory applications generally require a small cell size in order to optimize the density of the memory array. As the size of a memory cell is reduced, a trade-off is made between the cell current, which determines sensing speed, and the cell size. A higher cell current results in a faster sensing speed, but also increases cell size and hence the size of the memory array. Conversely, a small cell size reduces the size of the array, but also reduces the cell current and therefore, the sensing speed.

In erasable programmable logic devices, such as EPALs and EEPALs, sensing speed and programmability (for adequate sense margin) have a much greater importance than cell size, since the EPROM or EEPROM array contributes a relatively small portion of the size of the total device. Previously, 2-transistor cells have been developed for EPROM and EPAL devices using NSAG (N-channel self-aligned gate) technology wherein the source and drain of the sources and drains of the memory cell array are self-aligned with the gates.

The 2-transistor cell provides significant advantages over 1-transistor cell. The 2-transistor cell has a common floating gate which spans each transistor. The width of the floating gate of the first transistor (the read transistor) may be optimized for a high IDS for increased sensing speed. Typically, this is accomplished by using a wide gate over the read transistor. Further, the second transistor (the "program" or "write" transistor) can be optimized for optimum programmability. Typically, this is accomplished by using a narrow gate for low programming current requirements.

Nonetheless, the NSAG 2-transistor cell has several shortcomings. In the NSAG 2-transistor cell, contacts are needed for each pair of drains (drains of adjacent cells may share a contact) and for every several sources in the array. The need for contacts increases the size of the cell, and the size of the larger source/drain regions. Using 1-micron technology, the cell area of the NSAG 2-transistor cell is approximately 96 microns².

Therefore, a need has arisen in the industry for a 2-transistor non-volatile memory cell with reduced size, without sacrificing sensing speed or programmability.

SUMMARY OF THE INVENTION

In accordance with the present invention, a 2-transistor cell is provided which substantially eliminates the disadvantages and problems associated with prior 2-transistor cells. The 2-transistor cell of the present invention comprises three diffused regions aligned substantially parallel to one another. A floating gate, typically formed from polysilicon, is disposed substantially perpendicular to the three parallel diffused regions and separated therefrom by an insulating layer. The control gate conductor defines a first channel region between said first and second diffused regions and a second channel region between said second and third diffused regions. The channel region between the first and second diffused regions is substantially wider than the channel region between the second and third diffused regions. The wide channel region provides a high source to drain current for high sensing speed, while the narrow second channel provides a low power programming transistor.

The present invention provides several advantages over the prior art. The parallel diffused regions reduce the number of contacts which need to be made to the source/drain regions, thereby reducing the size of the cell and increasing the reliability of the device.

In a second aspect of the present invention, each transistor in the 2-transistor cell is optimized according to its function. The program transistor incorporates a wide BN+ region in order to increase the capacitance between the control gate and the floating gate above the BN+ region relative to the capacitance between the floating gate and the substrate. This has the effect of increasing the programmability of the device. Further, the program transistor may be provided with a heavier channel concentration for higher injection efficiency. The read transistor, however, uses a narrow BN− region, thereby decreasing the source/drain capacitance. A lower channel concentration may be provided for the read transistor in order to reduce the capacitance of the transistor and increase the source to drain current. Further, the profile of the read transistor junction may slope gradually to reduce the efficiency of electron injection in the transistor. The read transistor may also be formed with a smaller gate oxide thickness relative to the gate oxide thickness of the program transistor in order to increase device gain.

In yet another aspect of the present invention, different isolation techniques may be used between cells to optimize the function of each transistor. A LOCOS isolation technique can be used to increase capacitive coupling between the control gate and floating gate, and to reduce bitline capacitance. Trench isolation can be used to reduce junction capacitance and increase isolation between cells.

In a further aspect of the present invention, the program transistor may comprise either a FAMOS transistor, or may use Fowler-Nordheim tunneling.

BRIEF DESCRIPTION OF THE DRAWINGS

For a more complete understanding of the present invention and the advantage thereof, reference is now made to the following descriptions taken in conjunction with the accompanying drawings in which:

FIG. 4b illustrates a cross-sectional side view of the array of FIG. 4a;

FIG. 5b illustrates a cross-sectional side view of the array of FIG. 5a;

FIG. 6b illustrates a cross-sectional side view of the transistor of FIG. 6a.

DETAILED DESCRIPTION OF THE INVENTION

The preferred embodiment of the present invention is best understood by referring to FIGS. 1-7 of the drawings, like numerals being used for like and corresponding parts of the various drawings.

Figure 1:
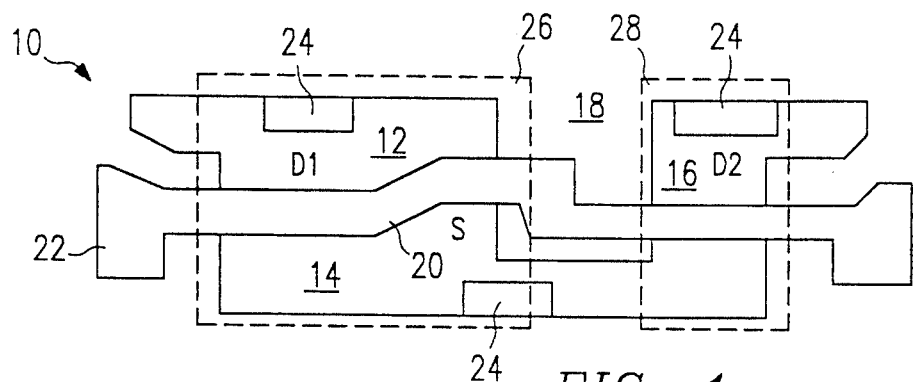
FIG. 1 illustrates a top plan view of an NSAG 2-transistor cell.

FIG. 1 illustrates a top plan view of a prior art 2-transistor cell implemented in NSAG technology. The prior art cell 10 of FIG. 1 comprises a first drain 12, a common source 14 and a second drain 16 formed in a semiconductor substrate 18. A floating gate 20 defines channels between the first drain 12 and the common source 14 and the second drain 16 and the common source 14. The floating gate 20 is covered by a control gate 22. Contacts 24 are made to each of the diffused regions 12-16.

The cell 10 comprises 2-transistors 26 and 28. The read transistor 26 comprises the first drain 12 and common source 14. The program transistor 28 comprises the second drain 16 and the common source 14. The width of the floating gate 20 and the read transistor 26 is large compared to the width of the floating gate between the second diffused region 16 and the common source 14 to provide a larger source to drain current through the read transistor 26.

Importantly, each diffused region 14-16 of the NSAG cell 10 must be contacted in order to supply voltage to the various diffused regions. To contact a diffused region, a contact window is etched through an oxide layer covering the diffused region. Metal is deposited within the contact window and interconnect layer is disposed over the oxide layer and the metal contacts to form electrical paths between the various devices. Formation of the contact window requires a separate masking level; since alignment between masks is not exact, certain design rules must be followed. The design rules determine the smallest area which can be contacted, which increases the size of the diffused regions. Further, in a tightly packed array, shorts may be caused by an improperly etched metal interconnect layer and open circuits may occur by improperly etched contact windows. In short, the requirement for contacts to each diffused region increases the size of the array and reduces the manufacturability and reliability of the memory cells therein.

Figure 2:
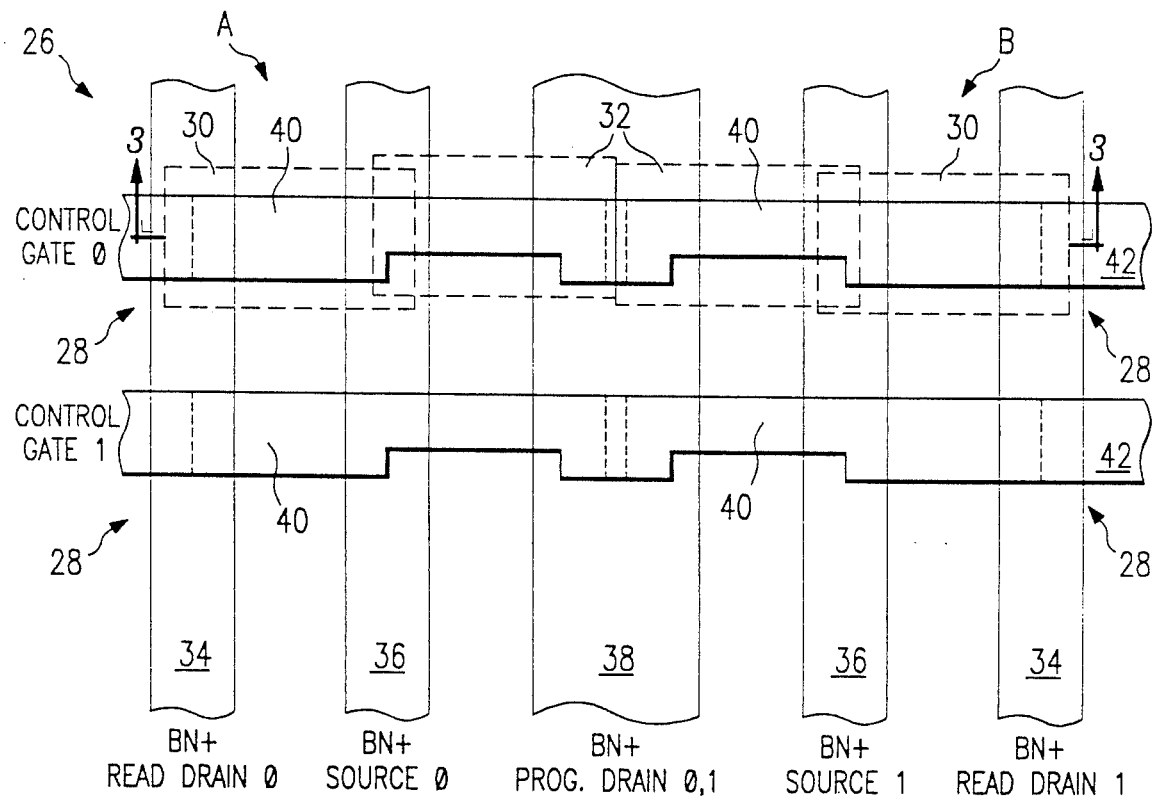
FIG. 2 illustrates a top view of an array of 2-transistor cells as described by the present invention.
Figure 3:
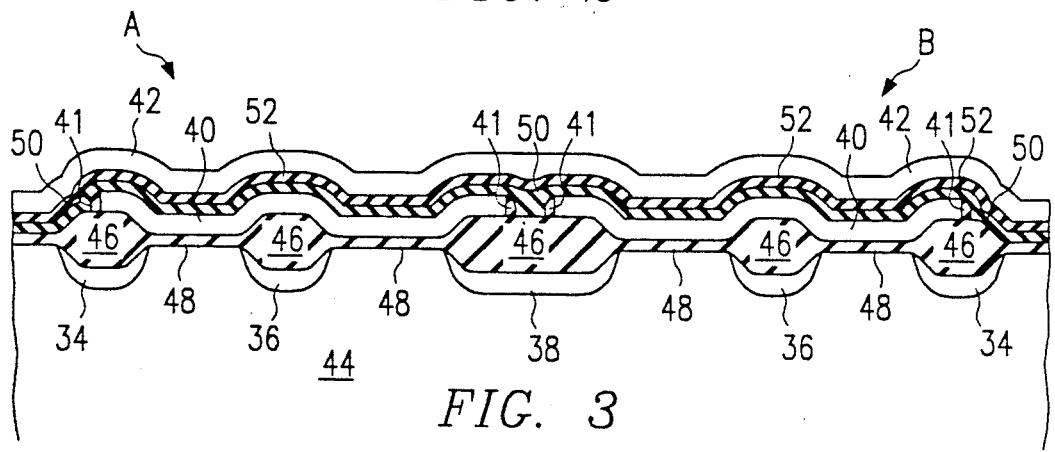
FIG. 3 illustrates a cross-sectional side view of the array of FIG. 2.

Referring now to FIGS. 2 and 3, a top plan view and cross-sectional side view of the present invention are shown, respectively. Referring to FIG. 2, the portion of the array 26 shown comprises four 2-transistor memory cells 28. Each memory cell 28 comprises a read transistor 30 and a program transistor 32. Each memory cell 28 comprises three diffused regions, a read drain 34, a source 36, and a program drain 38. In the illustrated embodiment, each diffused regions 34-38 comprises a buried N+ region; the diffused regions 34-38 are disposed substantially parallel to one another. A floating gate 40 extends across all three diffused regions 34-38 therein A control gate 42 overlies adjacent floating gates.

In the embodiment illustrated in FIG. 2, it should be noted that the program drain 38 may be shared between adjacent memory cells 28.

FIG. 3 illustrates a cross-sectional side view of the memory array illustrated in FIG. 2.

A method of making the array 26 will be described in connection with FIGS. 2 and 3. The starting material is a slice of P-type silicon of which the substrate 44 is only a very small portion. The slice is perhaps 6 inches in diameter, while the portion shown in array 26 is only a few microns wide. A number of process steps would be performed to create transistors peripheral to the array, and these will not be discussed here. For example, the memory device may be of the complementary field-effect type having N-wells and P-wells formed in the substrate as part of a prior process to create peripheral transistors. The first step related to the cell array of the invention is applying oxide and silicon nitride coatings and patterning these coatings using photoresist to leave nitride over what will be the channel regions, sources, drains, and bitlines 34, 36 and 38, while exposing the areas where the thick field oxide is to be formed. A boron implant at about $8 \times 10^{12}$ cm$^{-2}$ dosage is performed to create a P+ channel stop beneath the field oxide. The field oxide is then grown to a thickness of about 9000 A by exposing the slice to steam at about 900° C. for several hours. The thermal oxide grows beneath the edges of the nitride, creating a "bird's beak" instead of a sharp transition.

The nitride is removed and, in the area where the bitlines 34, 36 and 38 are to be formed, an arsenic implant is performed at a dosage of about $6 \times 10^{15}$ cm$^{-2}$ at 135 KeV, using photoresist as an implant mask, to create the source/drain regions and bitlines. Next, another thermal oxide 46 is grown on the face to a thickness of about 2500 to 3500 A over the N— buried bitlines, during which time a thermal oxide of about 300 A will grow over the channel areas (due to the differential oxidation occurring when heavily-doped and lightly-doped silicon areas are exposed to oxidation at the same time), to create the oxide layers 46 above the source/drain regions and bitlines 34, 36 and 38. This oxidation is performed in steam at about 800° to 900° C.

A first polycrystalline silicon (poly 1) layer is deposited using low pressure chemical vapor depositing to a thickness of approximately 2,000 Angstroms. The poly 1 layer may be doped by diffusing POC13 for approximately ten minutes at a temperature of approximately 950° C. The poly 1 layer is then patterned and etched to define the floating gates in a first direction. At this point, poly 1 layer is partially patterned to provide strips which are subsequently patterned into individual floating gates when the control gates/wordlines are patterned in steps described below.

Sidewall oxide regions 41 may be formed on the edges of the floating gates 40 which were exposed in the previous etching step. Next, the poly 1 layer is deglazed and silicon dioxide layer 50 is deposited overlying the poly 1 using low pressure chemical vapor deposition at a temperature of approximately 800° C. to a thickness of approximately 250 Angstroms. Silicon nitride layer 52 is then formed on layer 50 by low pressure chemical vapor deposition at a temperature of approximately 800° C. to a thickness of approximately 250 Angstroms.

The structure is then subjected to thermal oxidation in a steam ambient at a temperature of 1000° C. for twenty minutes to seal the surface of silicon nitride film 52. A second poly crystalline silicon (poly 2) layer is next deposited by low pressure chemical vapor deposition to a thickness of approximately 4,000 Angstroms for formation of the control gates 42. The poly 2 layer, silicon layer 52, silicon dioxide layer 50 and poly 1 layer are then patterned using techniques well known in the art.

In operation, the memory cells 28 of the array 26 may be programmed and read by applying the appropriate voltage to the diffused regions and control gates. For illustration, two adjacent cells of FIG. 2 are labelled "A" and "B". Bitlines associated with cell A are identified by the subscript "0" and bitlines associated with cell B are identified by the subscript "1". The program drain, which is associated with both cells A and B is identified by the subscript "0,1."

To program cell A, program drain$_{0,1}$ would be taken to a high voltage of about +8 to 9 V, source$_0$ would be connected to a low voltage (0–0.5 volts), and control gate$_0$ would be connected to a high voltage of about 12.5 V. Source$_1$ would be disconnected from ground to prevent inadvertent programming of memory cells B.

In the read mode, all sources would be held at ground potential. Cell A could be read by applying a voltage of about less than 2 V to read drain$_0$ and a voltage of about 5 V ($V_{dd}$) to control gate$_0$.

The present invention as embodied in FIGS. 2 and 3 provides significant technical advantages. Since the diffused regions 34–38 are continuous regions between memory cells 28, it is not necessary to have contacts for every cell. Typically, the diffused regions 34–38 are contacted approximately once every sixteen cells. The resulting cell size, using 1.0 micron rules is approximately 67 microns$^2$, or about 70% of the size of the NSAG 2-transistor cell. Further, the reduced number of contacts increases the reliability of the memory array.

Figure 4A:
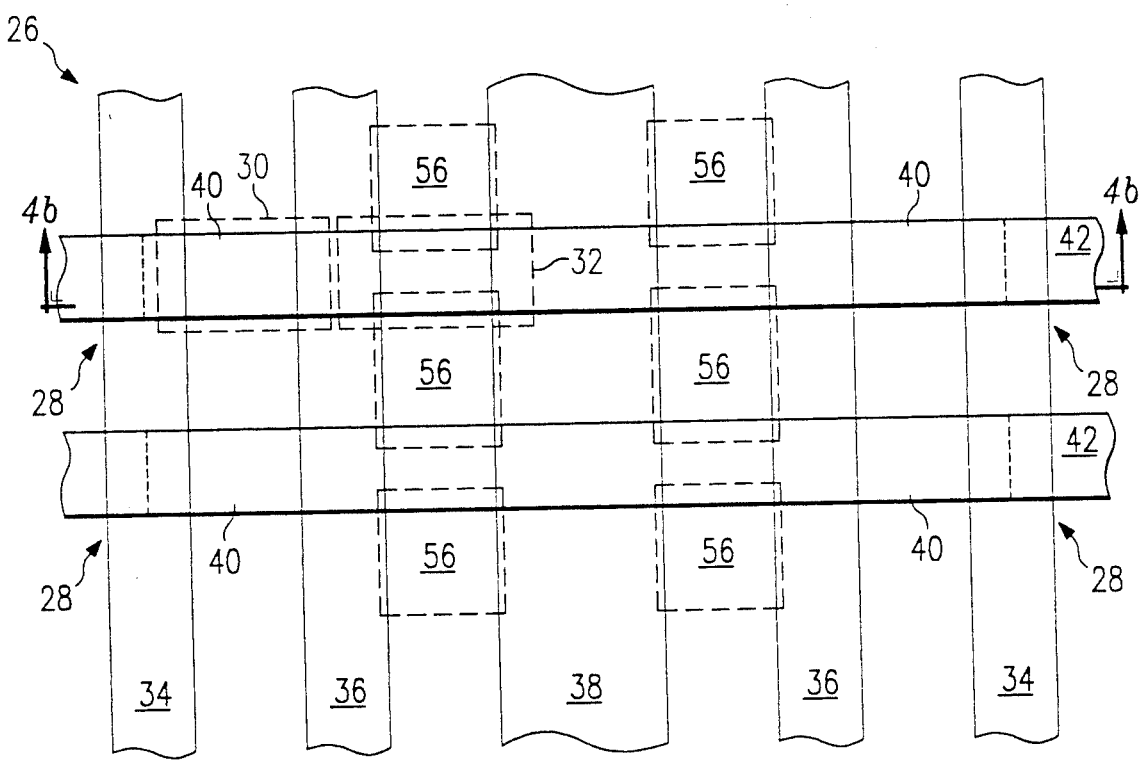
FIG. 4a illustrates a top plan view of the array of the present invention using LOCOS isolation.
Figure 4B:
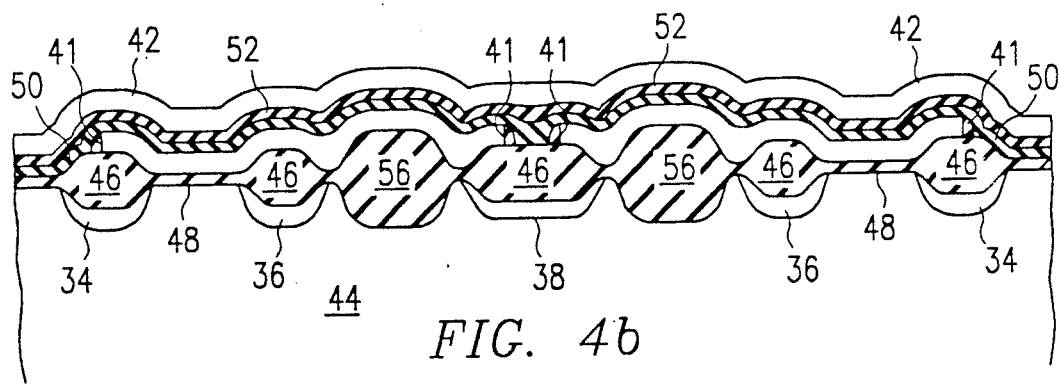

FIGS. 4a–b illustrate a top plan and cross-sectional side view of the transistor array of FIGS. 2 and 3 using field oxide isolation between memory cells. As shown in FIG. 4a, field oxide regions 56 have formed between the sources 36 and program drain 38 to provide isolation between the program transistor 32 of the memory cells 28. Field oxide regions 56 could also be formed between the read drain and the source to provide isolation for the read transistors 30.

The field oxide regions 50 typically formed by a LOCOS (local oxidation of silicon) process, provide a low-leakage isolation between junctions. A field oxide isolation reduces the bitline capacitance relative to junction isolation techniques. A reduced bitline capacitance increases the speed of the device.

Further, the field oxide isolation provides additional coupling between the control gate 42 and the floating gate 40 of the program transistor relative to the coupling between the floating gate and the substrate. This is best illustrated in connection with 4b, where it can be seen that the field oxide region 56 provides a thick dielectric between the floating gate and the substrate in areas where the floating gate overlaps the field oxide region 56. A higher coupling between the control gate 42 and floating gate 40 in the program transistor increases the programmability of the device.

Figure 5A:
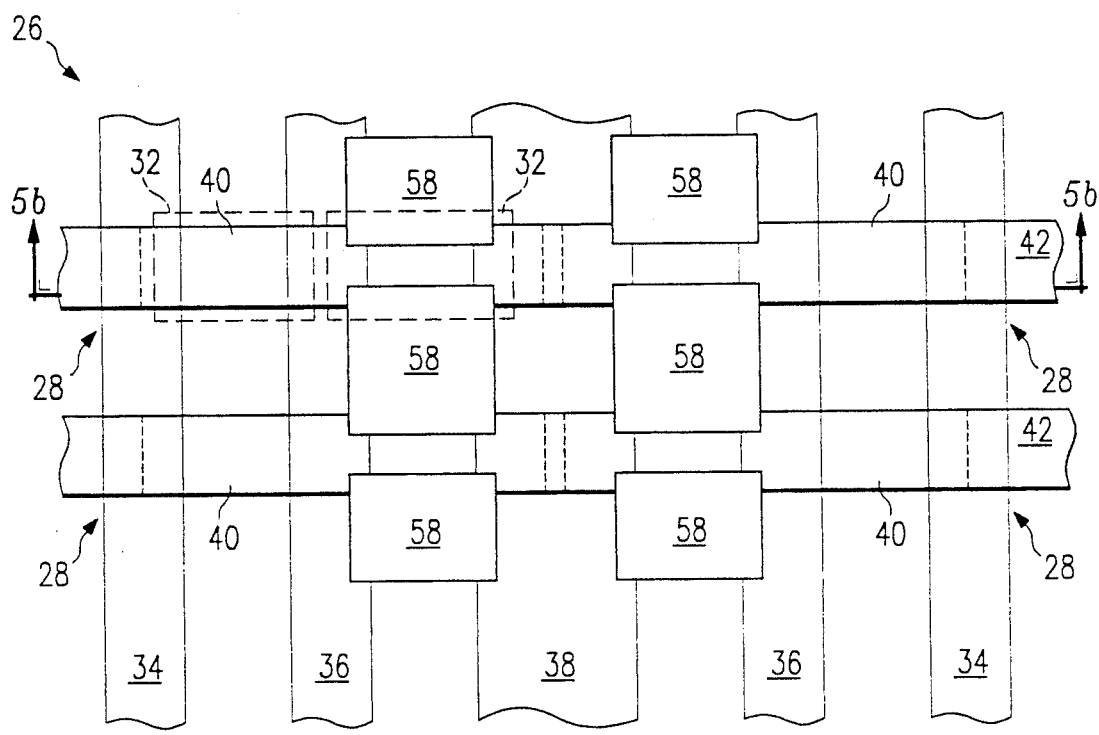
FIG. 5a illustrates a top plan view of the present invention using trench isolation.
Figure 5B:
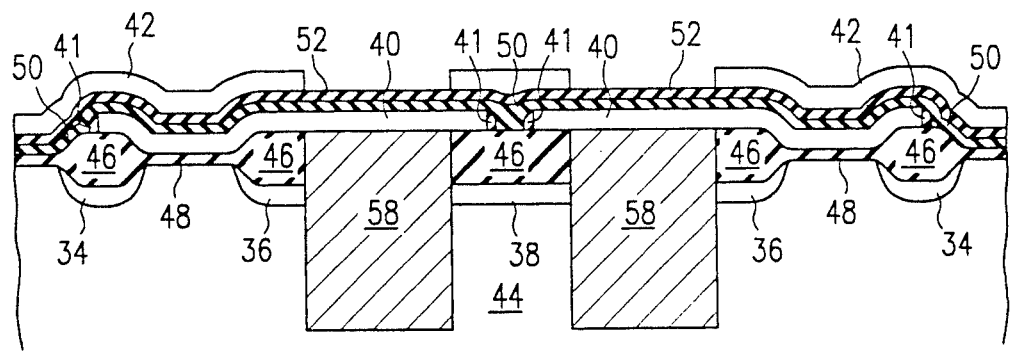

FIGS. 5a–b illustrate a top plan and cross-sectional side view of the transistor of FIGS. 2 and 3. Using trench isolation, a trench 58 is etched into the substrate between bitlines and is filled with a dielectric such as oxide. As a result, less P+ diffusion for junction isolation is needed, reducing the junction capacitance. Once again, trench isolation could be used for the read transistors 30 as well as the program transistors 32.

Other techniques may be used to optimize the functions of the read and program transistors 30 and 32. The program drain 38 may be made wide to allow an overlap between the floating gate 40 and control gate 42 to increase the coupling between the two. As previously discussed, increased coupling between the floating gate 40 and control gate 42 increases the programmability of the rate transistor. The read drain 34, on the other hand, may be made narrow to reduce the capacitance of that diffused region.

By providing a heavier channel ion concentration for the program transistor 32, a more abrupt junction will be formed thereby increasing electron hole pair formation. This results in highly efficient electron injection into the floating gate of the program transistor 32. The read transistor 30 may be provided with a lighter channel concentration to reduce the efficiency of the electron injection therein, lowering the read disturb of the cell. A lower channel concentration will also reduce the capacitance of the device, resulting in a faster sensing speed for the read transistor. Further, the read transistor may be formed with a thinner gate oxide, relative to the program transistor, to increase the device gain.

Figure 6A:
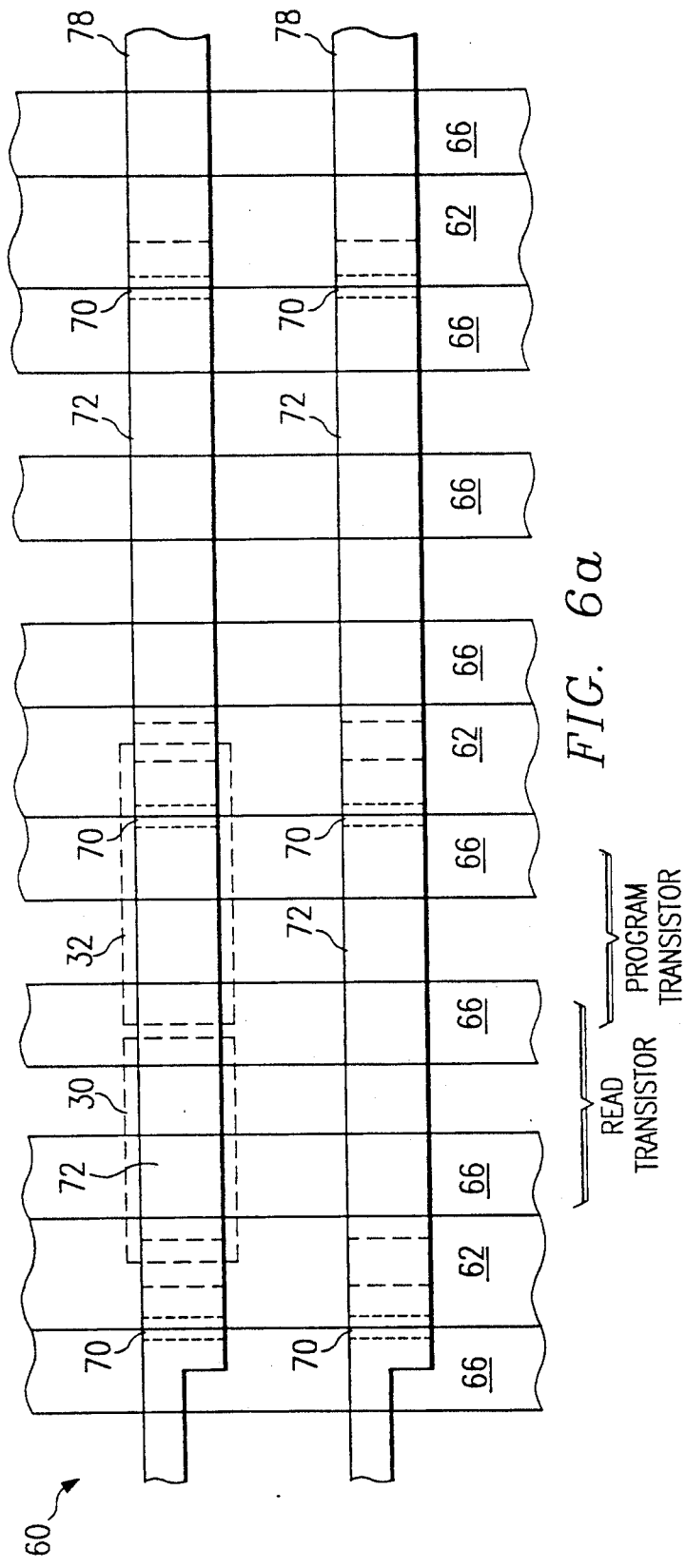
FIG. 6a illustrates a top plan view of the present invention using a tunnel oxide for Fowler-Nordheim programming.
Figure 6B:
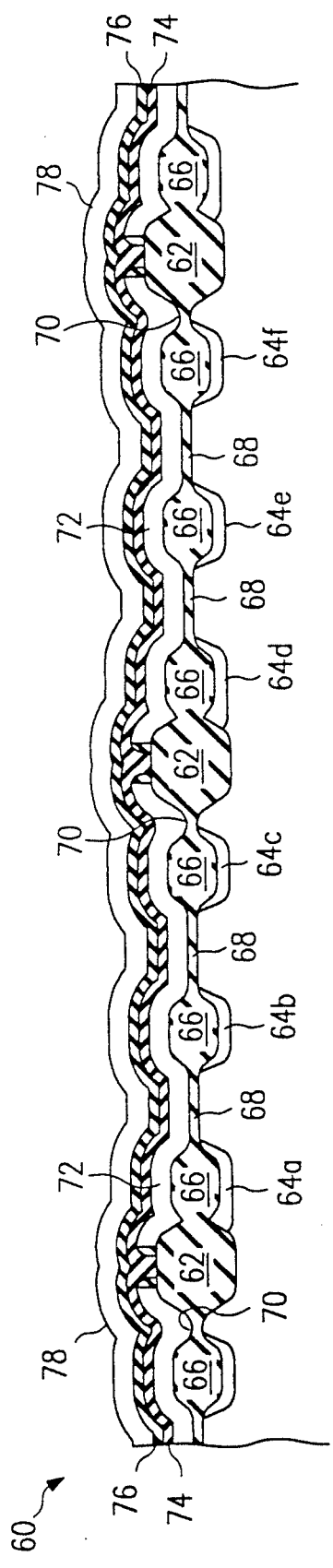

FIGS. 6a–b illustrate a memory array according to the present invention having a tunnel oxide for Fowler-Nordheim tunnelling.

A method of making the device of FIGS. 6a–b will be described. The first step related to the cell array of the invention is applying oxide and silicon nitride coatings and patterning these coatings using photoresist to leave nitride over what will be the channel regions, sources, drains, and bitlines 64a–f, while exposing the areas where the thick field oxide 62 is to be formed. A boron implant at about $8 \times 10^{12}$ cm$^{-2}$ dosage is performed to create a P+ channel stop beneath the field oxide 62. The field oxide is then grown to a thickness of about 9000 A by exposing to steam at about 900° C. for several hours. The thermal oxide grows beneath the edges of the nitride, creating a "bird's beak" instead of a sharp transition.

The nitride is removed and, in the area where the bitlines 64a–f are to be formed, an arsenic implant is performed at a dosage of about $6 \times 10^{15}$ cm$^{-2}$ at 135 KeV, using photoresist as an implant mask, to create the source/drain regions and bitlines. Next, another thermal oxide 66 is grown on the face to a thickness of about 2500 to 3500 A over the N+ buried bitlines, during which time a thermal oxide of about 300 A will grow over the channel areas (due to the differential oxidation occurring when heavily-doped and lightly-doped silicon areas are exposed to oxidation at the same time), to create the oxide layers 68 above the source/drain regions and bitlines 64. This oxidation is performed in steam at about 800° to 900° C. At the transition areas where the bird's beak has been formed, the edge of the originally-formed thermal oxide has masked the arsenic implant so the concentration is lower and so the oxide growth in that area is less than that of the oxide 62 or the oxide 66.

A window 70 is opened in the oxide in the transition area. This is done using photoresist as a mask, and etching through the oxide of transition area to the bare silicon, then regrowing a thinner oxide for the tunnel window 70. During oxidation of tunnel window 70, gate oxide 68 will grow to approximately 350 A. Optionally, a light phosphorus implant in the tunnel window 70 can be used for enhanced field plate breakdown voltage.

Because of the curved surface of transition area, the width of tunnel window 70 may be controlled by varying the length of time for the etch through transition area.

The remaining steps of forming the floating gates 72, interlevel oxide 74, interlevel nitride 76 and control gates 78 are essentially as described above in connection with FIGS. 2 and 3.

In the preferred embodiment, the tunnel window 70 is placed on the opposite side of the program source from the drain. This placement makes the alignment of the masks less critical and enhances the field plate breakdown voltage of the junction between the buried N+ region and the substrate. Formation of the tunnel window 72 and the advantages and operation thereof is discussed in greater detail in U.S. patent application Ser. No. 07/402,399, entitled "Electrically-Erasable, Electrically-Programmable Read-Only Memory Cell," to Gill, filed May 30, 1989, and U.S. patent application Ser. No. 07/374,113, to Gill, filed contemporaneously herewith, entitled "Byte- and Block-Erasing of an Electrically Eraseable and Programmable Read-Only Memory Array" which are incorporated by reference herein.

The EEPROM cell of FIGS. 6a-b may be programmed with a voltage $V_{pp}$ applied to the selected control gate 78 of about +16 v to +18 v with respect to the source of the selected cell. In the illustrated embodiment, source/drain regions 64c and 64f comprise the sources for the program transistors and source/drain regions 64b and 64e comprise the drains for the program transistors. The source 64c or 64f of the selected cell is at ground or other reference voltage. The selected drain 64b or 64 may be allowed to float so that there is no potential difference between source and drain, and there is little or no current in the source/drain path. The Fowler-Nordheim tunnelling across the tunnel oxide 70 charges the floating gate 72 of the selected cell, resulting in a shift in threshold voltage of about 3-6 volts after a programming pulse approximately 10 milliseconds in length.

A selected cell is erased by applying a voltage $V_{cc}$ of about −5 v on the selected control gate 78 and a voltage of about +9 to 10 v on the selected source 64c or 64f. The drain 64b or 64e is allowed to float. The deselected wordlines (control gates) are set at +9 v. During the erasure tunnelling, electrons flow from the floating gate 72 to the source 64c or 64f because the control gate 78 is negative with respect to the source.

When a "flash erase" is performed (all cells erased at one time), all of the drains in the array are allowed to float, all of the sources are at potential $V_{dd}$ (9 to 10 v), and all of the control gates are at potential $V_{cc}$ (−5 v).

The isolation techniques described in connection with FIGS. 4 and 5 and the techniques described herein for enhancing the programmability and sensing of the memory cells apply with equal force to the EEPROM described in connection with FIGS. 6a-b.

Although the preferred embodiment of the invention has been described in detail, it should be understood that the various changes, substitutions and alterations can be made therein without departing from the spirit and scope of the invention as defined by the appended claims.

What is claimed is:

1. A method of forming a non-volatile memory comprising the steps of:
    forming first, second, and third elongate doped regions of a first conductivity type in a substrate of a second conductivity type, said first, second and third doped regions being substantially parallel;
    forming a floating gate overlying and separated from said first, second and third doped regions;
    forming a control gate defining a first channel between said first and second doped regions and a second channel between said second and third doped regions.

2. The method of claim 1 wherein said step of forming a control gate comprises the step of forming a control gate having a wide portion over said first channel and a narrow portion over said second channel.

3. The method of claim 1 and further comprising the step of forming field oxide regions defining the second channel prior to forming said control gate and said floating gate.

4. The method of claim 1 and further comprising the step of forming trench isolation regions adjacent said second channel.

5. The method of claim 1 and further comprising the step of doping said first channel with a first ion concentration and doping said second channel with a second ion concentration greater than said first ion concentration.

6. The method of claim 1 and further comprising the step of forming a gate oxide region overlying said first and second channels and underlying said floating gate.

7. The method of claim 6 and further comprising the step of forming a tunnel oxide beneath said floating gate to allow programming by Fowler-Nordheim tunnelling.

8. The method of claim 1 wherein said step of forming said third doped region comprises a step of forming a third doped region having greater width than said first and second doped region.

9. The method of claim 1 and further comprising the step of forming field oxide regions over said first, second and third doped regions.

10. The method of claim 1 and further comprising the steps of:
    forming fourth and fifth elongate doped regions substantially parallel to said first, second and third doped regions; and
    forming additional floating gates overlying and substantially perpendicular to said third, fourth and fifth doped regions.

* * * * *